US011365851B2

(12) United States Patent
Ozaki et al.

(10) Patent No.: US 11,365,851 B2
(45) **Date of Patent: *Jun. 21, 2022**

(54) LIGHTING MODULE AND LIGHTING APPARATUS

(71) Applicant: NICHIA CORPORATION, Anan (JP)

(72) Inventors: Tomonori Ozaki, Anan (JP); Motokazu Yamada, Tokushima (JP)

(73) Assignee: NICHIA CORPORATION, Anan (JP)

( * ) Notice: Subject to any disclaimer, the term of this patent is extended or adjusted under 35 U.S.C. 154(b) by 46 days.

This patent is subject to a terminal disclaimer.

(21) Appl. No.: 16/567,580

(22) Filed: Sep. 11, 2019

(65) Prior Publication Data

US 2020/0003370 A1 Jan. 2, 2020

Related U.S. Application Data

(63) Continuation of application No. 15/337,786, filed on Oct. 28, 2016, now Pat. No. 10,451,225.

(30) Foreign Application Priority Data

Oct. 30, 2015 (JP) ............................ JP2015-214661

(51) Int. Cl.
*F21K 9/60* (2016.01)
*F21V 23/00* (2015.01)
(Continued)

(52) U.S. Cl.
CPC ............. *F21K 9/60* (2016.08); *F21V 3/0625* (2018.02); *F21V 23/005* (2013.01); (Continued)

(58) Field of Classification Search
CPC .......... F21K 9/60; F21K 9/62; F21Y 2113/10; F21Y 2113/13; F21Y 2113/20; F21V 5/007; F21V 9/40
See application file for complete search history.

(56) References Cited

U.S. PATENT DOCUMENTS 9,127,815 B2 * 9/2015 Tachino .................. B60Q 3/47
2003/0053310 A1 3/2003 Sommers
(Continued)

FOREIGN PATENT DOCUMENTS

JP 2011-222182 A 11/2011
JP 2012-231036 A 11/2012
(Continued)

OTHER PUBLICATIONS

Non-Final Office Action on U.S. Appl. No. 15/337,786 dated Dec. 18, 2018.

(Continued)

*Primary Examiner* — Julie A Bannan
(74) *Attorney, Agent, or Firm* — Foley & Lardner LLP

(57) ABSTRACT

A lighting module includes a mounting board; a plurality of first light sources located on the mounting board; and one or more second light sources located on the mounting board. A wavelength range and/or a correlated color temperature of the plurality of first light sources is different from a wavelength range and/or a correlated color temperature of the one or more second light sources. A quantity of the first light sources is greater than a quantity of the one or more second light sources. A light distribution angle of each of the one or more second light sources is greater than a light distribution angle of each of the plurality of first light sources.

13 Claims, 11 Drawing Sheets

(51) Int. Cl.

| | |
|---|---|
| *F21Y 113/13* | (2016.01) |
| *F21Y 105/18* | (2016.01) |
| *F21Y 105/16* | (2016.01) |
| *F21Y 115/10* | (2016.01) |
| *F21V 3/06* | (2018.01) |

(52) U.S. Cl.

CPC ....... *F21Y 2105/16* (2016.08); *F21Y 2105/18* (2016.08); *F21Y 2113/13* (2016.08); *F21Y 2115/10* (2016.08)

(56) References Cited

U.S. PATENT DOCUMENTS

| | | | | |
|---|---|---|---|---|
| 2005/0073495 | A1* | 4/2005 | Harbers | G02F 1/133603 345/102 |
| 2006/0087866 | A1* | 4/2006 | Ng | G02F 1/133603 362/612 |
| 2006/0267037 | A1* | 11/2006 | Lim | F21V 5/008 257/98 |
| 2010/0165618 | A1 | 7/2010 | Vissenberg et al. | |
| 2012/0074432 | A1 | 3/2012 | Chou | |
| 2012/0274203 | A1 | 11/2012 | Yokotani | |
| 2012/0307490 | A1* | 12/2012 | Ellis | F21V 3/049 362/235 |
| 2014/0306249 | A1 | 10/2014 | Tachino et al. | |
| 2015/0098218 | A1 | 4/2015 | Kai et al. | |
| 2015/0263246 | A1* | 9/2015 | Hiramatsu | H01L 25/0753 362/231 |

FOREIGN PATENT DOCUMENTS

| | | | |
|---|---|---|---|
| JP | 2013-131442 | A | 7/2013 |
| JP | 2013-143250 | A | 7/2013 |
| JP | 2013-171777 | A | 9/2013 |
| JP | 2014-013744 | A | 1/2014 |
| JP | 2014-207149 | A | 10/2014 |
| JP | 2015-050122 | A | 3/2015 |
| JP | 2015-072838 | A | 4/2015 |
| WO | WO-2011/004320 | A1 | 1/2011 |
| WO | WO-2013/133147 | A1 | 9/2013 |

OTHER PUBLICATIONS

Notice of Allowance on U.S. Appl. No. 15/337,786 dated Jun. 12, 2019.

Notice of Allowance on U.S. Appl. No. 15/337,786 dated Aug. 8, 2019.

* cited by examiner

LIGHTING MODULE AND LIGHTING APPARATUS

CROSS-REFERENCE TO RELATED APPLICATION

This application is a continuation of U.S. patent application Ser. No. 15/337,786, filed on Oct. 28, 2016, which claims priority to Japanese Patent Application No. 2015-214661, filed on Oct. 30, 2015, the disclosures of which are hereby incorporated by reference in their entireties.

BACKGROUND

The present disclosure relates to a lighting module and a lighting apparatus including the same.

In recent years, in the fields of illumination, semiconductor light-emitting devices have begun to replace incandescent lamps and fluorescent lamps. A typical example of a semiconductor light-emitting device is an LED (Light Emitting Diode). A semiconductor light-emitting device makes it possible to realize a lighting apparatus that has a long lifetime and is low in power consumption, as compared to incandescent lamps and fluorescent lamps.

Depending on the semiconductor material used, a semiconductor light-emitting device is able to emit light of various emission wavelengths.

Therefore, semiconductor light-emitting devices of various emission colors may be combined to realize a lighting apparatus that permits color tuning.

Because a semiconductor light-emitting device is smaller than an incandescent lamp or a fluorescent lamp, it is also possible to realize a lighting apparatus that is thin or small in size, and/or of an attractive design.

For example, Japanese Laid-Open Patent Publication No. 2015-50122 discloses a lighting apparatus that includes a daylight color LED, a warm-white color LED, and a red LED, thus being capable of color tuning.

SUMMARY

One embodiment of the present disclosure provides a lighting module and a lighting apparatus that takes advantage of the characteristic aspects of semiconductor light-emitting devices as mentioned above.

A lighting module according to one embodiment includes: a mounting board; a plurality of first light sources arranged on the mounting board; and at least one second light source arranged on the mounting board.

A wavelength range or correlated color temperature of the plurality of first light sources is different from a wavelength range or correlated color temperature of the at least one second light source. The quantity of the first light sources is greater than the quantity of the second light sources, and each of the at least one second light source has a greater light distribution angle than a light distribution angle of each of the plurality of the first light sources.

The second light sources, which are fewer in number, have a greater light distribution angle. As a result, between the first light sources and the second light sources, difference in evenness in luminance distribution within the light emitting surface can be reduced. Because the quantity of second light sources to be mounted can be reduced, it is possible to reduce the manufacturing cost.

DETAILED DESCRIPTION OF THE EMBODIMENTS

In the case where a lighting apparatus includes light sources of warm-white color and light sources of daylight color, the quantity of warm-white light sources, which are mainly used during nighttime, may be smaller than the quantity of daylight color light sources. But in this case, a smaller quantity of warm-white light sources is provided per unit area of the lighting apparatus. Thus, when only the warm-white light sources are turned on, uneven luminance of the lighting apparatus tends to occur, which may degrade the appearance of the lighting apparatus when color adjusted to warm-white.

In order to maintain the appearance, a cover to diffuse light from the light sources may be provided spaced apart from the light sources, for example. However, this configuration increases the thickness of the entire lighting apparatus and will result in the entire lighting apparatus being thick, thus hindering one characteristic aspect of a semiconductor light-emitting device, which is being smaller than an incandescent lamp or a fluorescent lamp.

It might also be possible to provide the same quantity of warm-white light sources as the quantity of daylight color light sources, and control the warm-white light sources to be dimly lit by decreasing the power supplied thereto. In this case, however, the quantity of warm-white light sources cannot be reduced, and a control circuit for dimming needs to be provided, and so on, thus making it difficult to reduce the cost of the lighting apparatus.

In view of the foregoing, the inventors have conceived of a lighting module and a lighting apparatus having a novel structure. Hereinafter, an example lighting module and an example lighting apparatus according to an embodiment will be described in detail. The embodiments shown below are intended as illustrative to give a concrete form to technical ideas of the present invention, and the scope of the invention is not limited to those described below.

Overall Structure of Lighting Apparatus

Figure 1:
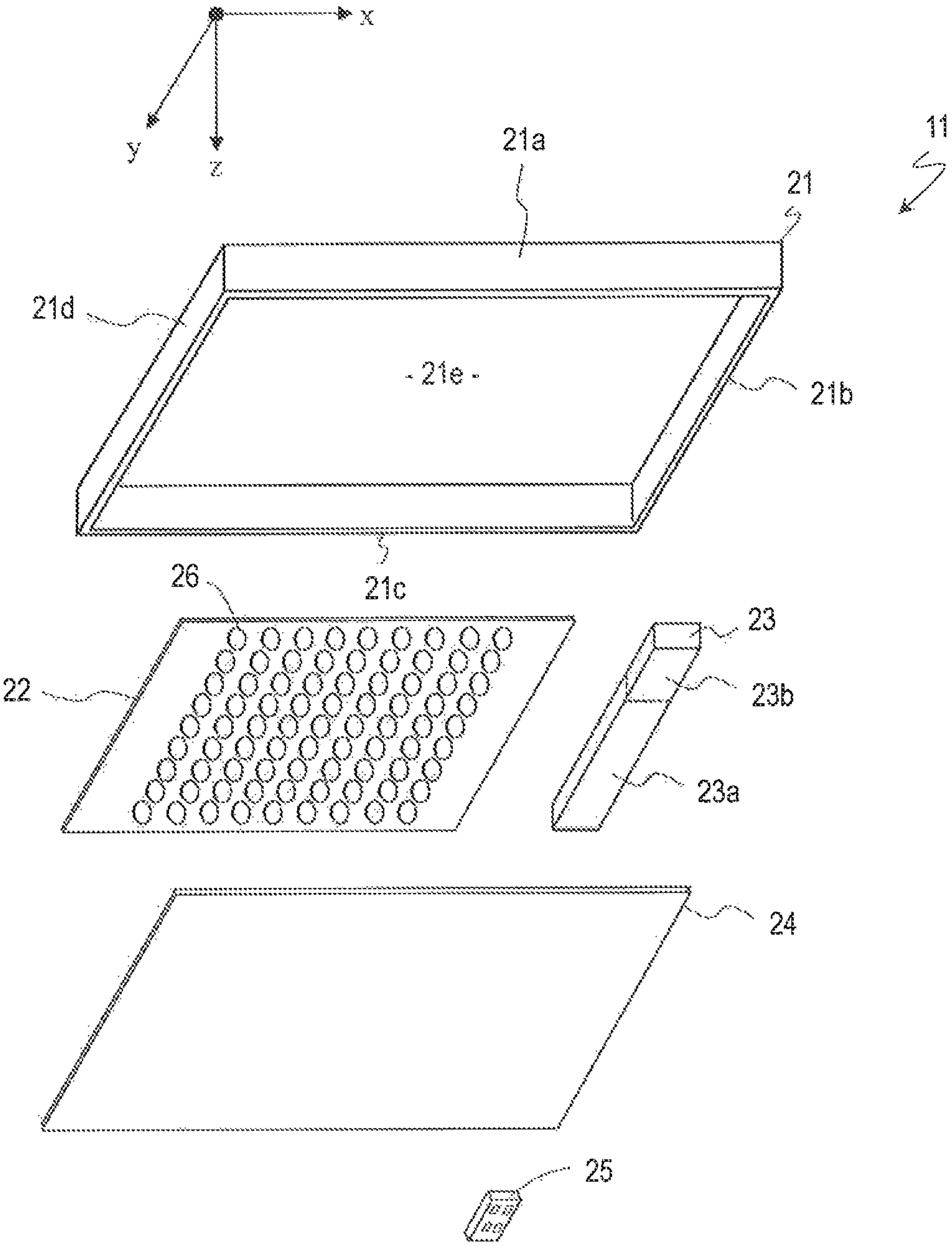
FIG. 1 is a schematic exploded perspective view showing an example lighting apparatus according to an embodiment.

FIG. 1 is an exploded perspective view showing an example lighting module and an example lighting apparatus according to the present embodiment. A lighting apparatus 11 includes a housing 21, a lighting module 22, a control circuit 23, and a cover 24. Wiring lines to which power is supplied from an external AC or DC power source are connected to the control circuit 23. Wiring lines are employed also to provide electrical connection between the control circuit 23 and the lighting module 22.

The housing 21 supports and accommodates the lighting module 22 and the control circuit 23. The housing 21 supports the cover 24 at a predetermined interspace from the lighting module 22. In the present embodiment, the housing 21 includes, for example, a bottom portion 21*e* and four lateral portions 21*a*, 21*b*, 21*c* and 21*d*, such that the lighting module 22 and the control circuit 23 are disposed on one surface of the bottom portion 21*e*. The lighting module 22 and the control circuit 23 are located within a space that is created by the bottom portion 21*e* and the four lateral portions 21*a*, 21*b*, 21*c* and 21*d*. As shown in FIG. 1, the plane of the bottom portion 21*e* is defined by the x axis and the y axis, whereas the thickness direction of the lighting apparatus 11 is defined by the z axis.

The lighting module 22 includes plural types of light sources 26, which differ in wavelength range or correlated color temperature. The structure of the lighting module 22 will be described later in detail.

The control circuit 23 includes, for example, a power circuit 23*a* and a receiver circuit 23*b*. The power circuit 23*a* converts externally-received power to a voltage and current that is suitable for the light sources 26 being provided in the lighting module 22, and outputs the result to the lighting module 22. In response to a manual input from an operator, the control circuit 23 performs ON/OFF control of the light sources 26, control of an electric current value, and so on, thereby effecting color tuning of the light which goes out from the entire lighting module 22. Adjustment of the light intensity, i.e., dimming, may also be performed.

Instructions from an operator may be given with, for example, a remote control 25. The remote control 25 receives an input from the operator, and transmits a control signal which is based on the input. The receiver circuit 23*b* receives the control signal which is transmitted from the remote control 25, this control signal being output to the power circuit 23*a*.

The cover 24 closes the space which is created by the housing 21, thus dust or other foreign material is less likely to enter into the housing 21. In the case where light emitted from the light sources 26 of the lighting module 22 is transmitted through the cover 24, diffusion is effected to reduce unevenness of light from the lighting module 22. In other words, the cover 24 functions as a light-diffusing plate.

Structure of Lighting Module

Figure 2:
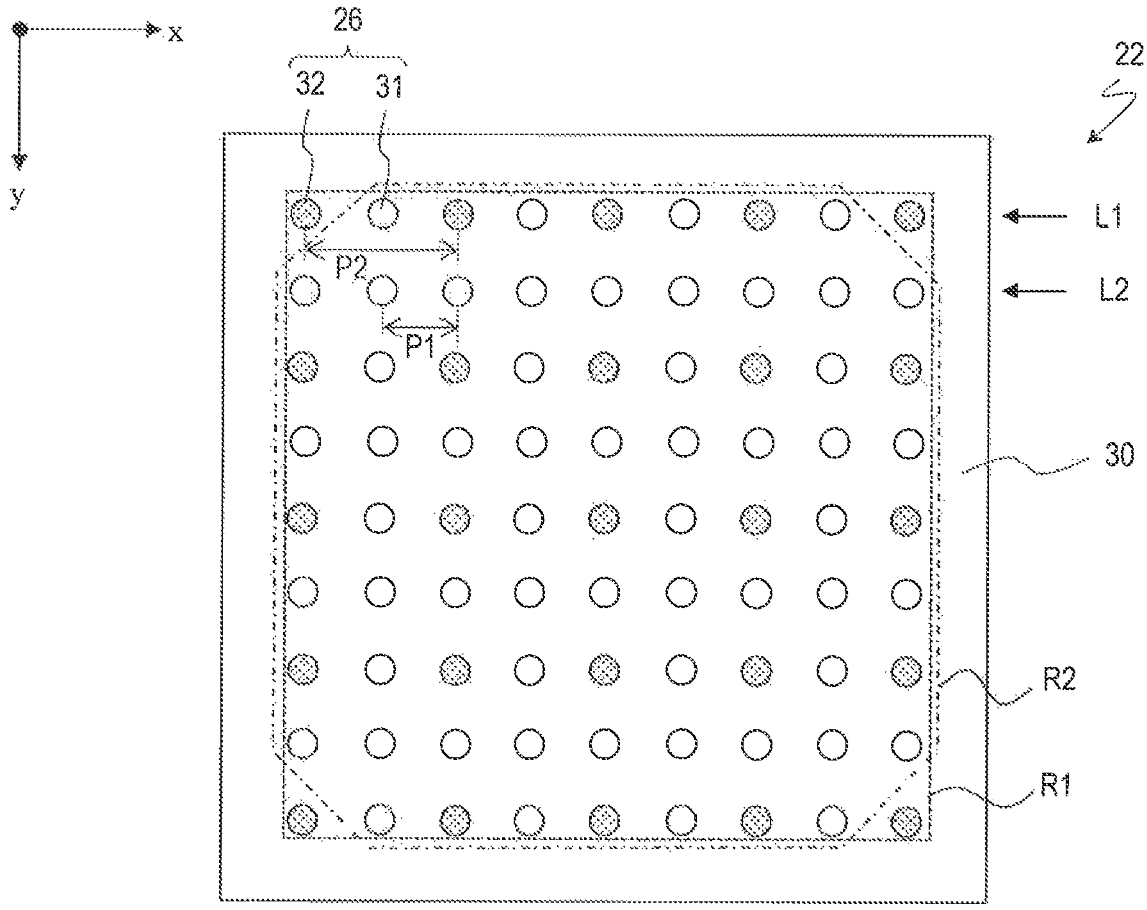
FIG. 2 is a plan view of a lighting module in the lighting apparatus shown in FIG. 1.

FIG. 2 shows a plan view of the lighting module 22. The lighting module 22 includes a mounting board 30 and plural types of light sources 26 which are arranged on the mounting board 30. The light sources 26 include a plurality of first light sources 31 and a plurality of second light sources 32. In the lighting module 22, the quantity of second light sources 32 is smaller than the quantity of first light sources 31. This is because the indoor brightness, i.e., illuminance, that would be required in the nighttime is smaller than the illuminance that would be required in the daytime. For example, the quantity of second light sources 32 may be 4/5 or less of the quantity of first light sources 31.

In the present embodiment, the first light sources 31 and the second light sources 32 are placed in a two-dimensional array on the mounting board 30. As shown in FIG. 2, in the case where the directions of the two-dimensional array are an x direction and a y direction, which are orthogonal to each other, the first light sources 31 are arranged along the x direction at a pitch P1 in any row L2, but are arranged along the x direction at a pitch P2 in any row L1 that is adjacent to the row L2. Rows L1 and L2 are alternately arranged at the pitch P1 along the y direction. On the other hand, the second light sources 32 are arranged at the pitch P2 along the x direction and along the y direction. The pitches P1 and P2 are each defined as distances between centers of the adjacent two first light sources 31 or the adjacent two second light sources 32 being arrayed on the mounting board 30. In the present embodiment, the pitch P2 is greater than the pitch P1, such that the pitch P2 is twice as large as the pitch P1. The smallest array pitch of the first light sources 31 is the pitch P1, whereas the smallest array pitch of the second light sources 32 is the pitch P2.

As shown in FIG. 2, the first light sources 31 and the second light sources 32 are arranged in mixture on the mounting board 30. As used herein, to be "in mixture" means that the region in which the plurality of first light sources 31 form a two-dimensional array and the region in which the plurality of second light sources 32 form a two-dimensional array have an overlap. In the present embodiment, the first light sources 31 are arrayed in a region R1 which is indicated by dotted lines, and the second light sources 32 are arrayed in a region R2 which is indicated by dot-dash lines. The region R1 contains the region R2.

Thus, in the lighting module 22, the quantity of second light sources 32 is smaller than the quantity of first light sources 31, and also the array pitch is relatively larger in the second light sources 32. Therefore, when lighted, unevenness in the luminance distribution is greater in the second light sources 32 than in the first light sources 31. In order to reduce the unevenness in luminance distribution within the plane of the second light sources 32, each second light source 32 has a broader light distribution angle than does each of the first light sources 31. A more detailed description on the light distributions of the light sources will be described below.

Structure of First and Second Light Sources

In the present embodiment, light that is emitted by the first light sources 31 differs in wavelength range or correlated color temperature from light which is emitted by the second light sources 32. The first light sources 31 and the second light sources 32 emit light of different wavelength ranges or correlated color temperatures, so that the color of light emitted from the lighting apparatus 11 can be adjusted by selectively lighting the first light sources 31 and the second light sources 32, or adjusting the electrical power supplied to the first light sources 31 and the second light sources 32.

The first light sources 31 and the second light sources 32 may emit white light of correlated color temperatures that are different from each other. In this case, the correlated color temperature of the second light sources 32 is preferably lower than the correlated color temperature of the first light sources 31. For example, it is preferable that the first light sources 31 emit daylight-like white light and that the second light sources 32 emit warm-white light. As described earlier, the illumination that would be required in the nighttime might be darker than that in the daytime. Therefore, the quantity of second light sources 32 to emit warm-white light, which is mainly used for nighttime illumination, may be decreased, thereby reducing the cost associated with the lighting apparatus. "Warm-white color" refers, for example, to a correlated color temperature in a range of 2000K to 4500K, and "daylight color" refers, for example, to a correlated color temperature in a range of 5000K to 6500K.

Figure 3:
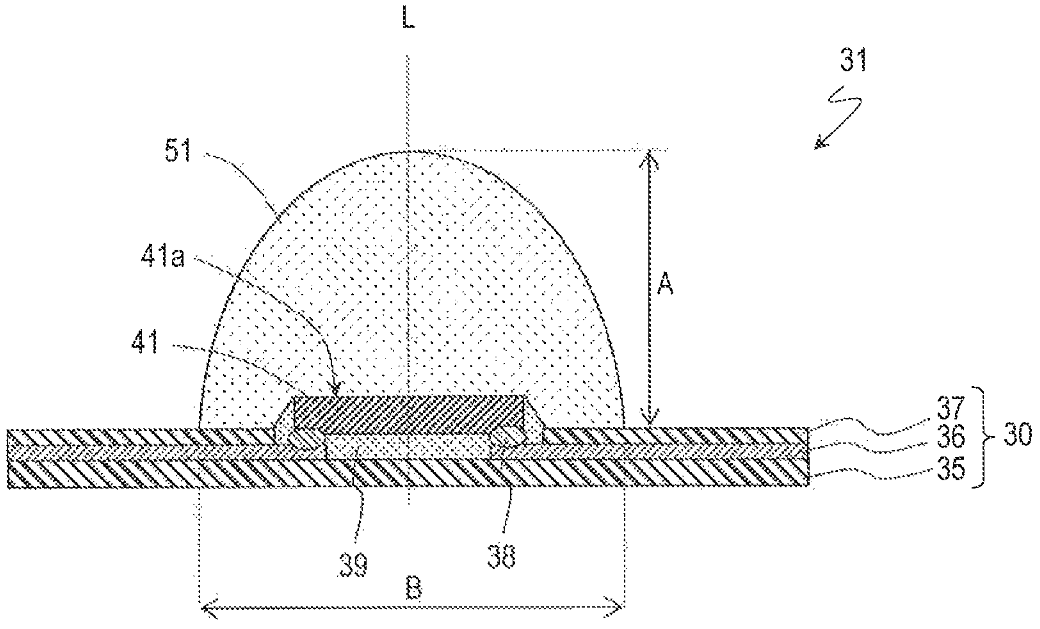
FIG. 3 is a cross-sectional view of a first light source mounted in the lighting module shown in FIG. 2.
Figure 4:
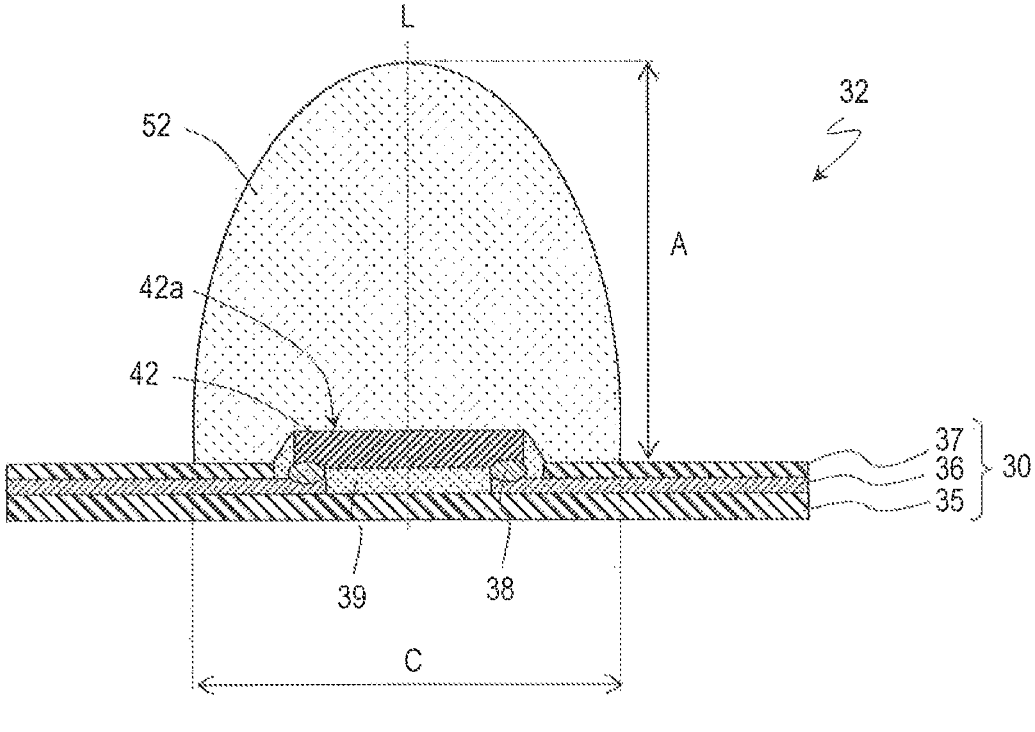
FIG. 4 is a cross-sectional view of a second light source mounted in the lighting module shown in FIG. 2.

FIG. 3 and FIG. 4 schematically show cross-sectional structures of a first light source 31 and a second light source 32, respectively. Between the first light source 31 and the second light source 32, a difference in the wavelength range or correlated color temperature of the outgoing light exists. The second light source 32 has a broader light distribution than that of the first light source 31.

As shown in FIG. 3, the first light source 31 includes a first light-emitting element 41 disposed on the mounting board 30, and a first cover member 51 covering at least a light emitting surface 41*a* of the first light-emitting element 41. The mounting board 30 includes a base 35, a conductive wiring 36, and an insulating member 37. Also, as shown in FIG. 4, the second light source 32 includes a second light-emitting element 42 disposed on the mounting board 30, and a second cover member 52 covering at least an emitting surface 42*a* of the second light-emitting element 42.

Hereinafter, members that are common to the first light source 31 and the second light source 32 will be described first. The base 35 supports the first and second light-emitting element 41, 42. On a surface of the base 35, conductive wiring 36 is provided to supply power to the first and second light-emitting element 41, 42. In the case where the mounting board 30 is a flexible mounting board, material of the base 35 may be, for example, phenolic resins, epoxy resins, polyimide resins, BT resins, polyphthalamide (PPA), polyethylene terephthalate (PET), or other resins. These resins are preferably selected as the material of the base 35 from the standpoints of cost reduction and formability, among others. The thickness of the mounting board may be chosen as appropriate; the mounting board may be a flexible mounting board that is capable of being fabricated by roll-to-roll method, or a rigid mounting board. A rigid substrate of a small thickness that attains sufficient degree of flexibility may also be used. From the standpoints of cost reduction and formability, these resins are preferably selected as the base 35. Alternatively, from the standpoints of thermal resistance and light resistance, ceramics may be selected for the base 35. Examples of ceramics include alumina, mullite, forsterite, glass ceramics, nitride-type (e.g., AlN) ceramics, carbide-type (e.g., SiC) ceramics, and LTCC. Among those, ceramics which are composed of alumina or whose main component is alumina can be suitably used for the base 35.

In the case where a resin is used for the material composing the base 35, an inorganic filler such as glass fibers, $SiO_2$, $TiO_2$, or $Al_2O_3$ may be mixed in the resin for improving mechanical strength, reducing coefficient of thermal expansion, improving light reflectance, and so on. The base 35 is configured to electrically insulate the conductive wiring 36, and a so-called metal substrate; a metal member having an insulating layer formed thereon, may be used.

The conductive wiring 36 is electrically connected to electrodes of the first and second light-emitting element 41, 42 to supply external power to the first and second light-emitting element 41, 42. In other words, it serves as electrodes, or portions thereof, for enabling external powering. Usually, the conductive wiring is formed in at least two discrete pieces of positive and negative.

The conductive wiring 36 is formed on at least the upper surface of the base 35 supporting the first and second light-emitting element 41, 42. The material of the conductive wiring 36 may be appropriately chosen in accordance with the material which is used for the base 35, the manufacturing method, and the like. For example, in the case where a ceramic is used for the material of the base 35, the material of the conductive wiring 36 is preferably a material having a high melting point that withstands the firing temperature of a ceramic sheet; for example, a metal having a high melting point is preferably used, e.g., tungsten or molybdenum. On a material having a high melting point, another metal material such as nickel, gold, or silver may be provided by plating, sputtering, vapor deposition, or the like.

In the case where a glass epoxy resin is used for the material of the base 35, the material of the conductive wiring 36 is preferably a material that permits easy processing. Furthermore, a rigid substrate of a small thickness that attains sufficient degree of flexibility is preferably selected as the material of the base 35 in order to promote the effects of weight reduction in the lighting apparatus based on reduced mounting board weight as well as thinness of the lighting apparatus.

In the case of employing the base formed by an injection molding using an epoxy resin, the conductive wiring 36 is preferably formed of a material which readily accepts processing such as a punching process, an etching process, or a bending process, and which has a relatively good mechanical strength. Examples of the conductive wiring include metal layers, lead frames formed of metals such as copper, aluminum, gold, silver, tungsten, iron, or nickel, or a copper-nickel alloy, phosphor bronze, a copper-iron alloy, molybdenum, and the like. A surface of the conductive wiring may further be coated with a metal material. Material of the conductive wiring may be appropriately selected from, for example, silver alone, or an alloy between silver and copper, gold, aluminum, rhodium, or the like, or a multilayer film of silver and such an alloy. For the method of placing the metal material, a sputtering technique, a vapor deposition technique, or the like may be used instead of a plating technique.

The connecting members 38 fix the first and second light-emitting element 41, 42 to the base 35 or the conductive wiring 36. The connecting members 38 are electrically insulative or electrically conductive. As shown in FIG. 3 and FIG. 4, in the case where the first and second light-emitting element 41, 42 are flip-chip mounted on the conductive wiring 36, the connecting members 38 are electrically conductive. More specific examples thereof include Au-containing alloys, Ag-containing alloys, Pd-containing alloys, In-containing alloys, Pb—Pd-containing alloys, Au—Ga-containing alloys, Au—Sn-containing alloys, Sn-containing alloys, Sn—Cu-containing alloys, Sn—Cu—Ag-containing alloys, Au—Ge-containing alloys, Au—Si-containing alloys, Al-containing alloys, Cu—In-containing alloys, a mixture of a metal and a flux, and the like. Electrodes which are formed on the bottom surfaces of the first and second light-emitting element 41, 42, and the conductive wiring 36 are electrically connected via the connecting members 38.

The electrically-conductive material composing the connecting members 38 may be in liquid form, paste form, solid form (a sheet, a block, powder, or a wire), as appropriately selected in accordance with the composition and the shape and the like of the base 35. Any such connecting member 38 may be formed of a single member, or several kinds thereof may be used in combination.

In the case where the connecting members 38 are electrically insulative, various resin adhesives or the like may be used. In this case, the connecting members 38 may connect the first and second light-emitting element 41, 42 to the base 35. The conductive wiring 36 is electrically connected to the first and second light-emitting element 41, 42.

Any portion of the conductive wiring 36 except for where it is electrically connected to the first and second light-emitting element 41, 42 or other elements is preferably covered with the insulating member 37. For example, the insulating member 37 may be an electrically insulating resin, e.g., solder resist, that covers the conductive wiring 36 and the exposed surface of the base 35, or a deposited electrically insulative layer of silicon oxide, silicon nitride, or the like. The electrically insulating resin can be a material which absorbs little light from the first and second light-emitting element 41, 42 and has an electrically insulative property. For example, epoxies, silicones, modified silicones, urethane resins, oxetane resins, acrylics, polycarbonates, polyimides, and the like may be used for the insulating member 37.

In the case where the insulating member 37 is provided, a whitish filler similar to the underfill material described below may be contained in the insulating member 37, thus not only providing insulation for the conductive wiring 36 but also reducing light leakage and absorption to enhance the light extraction efficiency of the lighting module 22.

In the case where the first or second light-emitting element 41, 42 is flip-chip mounted, it is preferable that an underfill 39 is formed between the first or second light-emitting element 41, 42 and the base 35. The underfill 39 contains a base material and a filler which is dispersed in the base material. The filler is added in order to allow light from the first or second light-emitting element 41, 42 to be efficiently reflected, and relax the stress which may be caused by a difference in thermal expansion coefficient between the first or second light-emitting element 41, 42 and the base 35.

The base material of the underfill 39 can be appropriately selected from materials which absorb little light from the light-emitting device. For example, epoxies, silicones, modified silicones, urethane resins, oxetane resins, acrylics, polycarbonates, polyimides, and the like may be used.

For the filler in the underfill 39, a white filler may be used to facilitate light reflection and enhance the light extraction efficiency. An inorganic compound can be preferably employed for the filler. As used herein, "white" encompasses, even if the filler itself may be transparent, any whitish appearance based on scattering due to a refractive index difference with the material around the filler.

The reflectance of the filler is preferably 50% or more, and more preferably 70% or more, with respect to light of the emission wavelength. In this manner, the light extraction efficiency of the lighting module 22 can be improved. An average particle size of the filler is preferably in a range of 1 nm to 10 μm. By ensuring that the filler has an average particle size in this range, the underfill attains good resin fluidity, such that it is sufficiently capable of covering even a narrow gap. The particle size of the filler is preferably in a range of 100 nm to 5 μm and more preferably in a range of 200 nm to 2 μm. The filler may be based on spherical shapes or scale shapes.

In order to secure the lateral surfaces of the light emitting element as light-extracting surfaces, it is preferable that the average particle size of the filler is appropriately adjusted and the material of the underfill is appropriately selected so that the lateral surfaces of the light emitting element are not covered by the underfill.

For the first and second light-emitting element 41, 42, a material known in the art may be used. In the present embodiment, light-emitting diodes are preferably used for the first and second light-emitting elements 41, 42. The emission wavelength ranges of the first and second light-emitting elements 41, 42 may be appropriately selected. For example, in order to emit blue or green light, a semiconductor layer which is composed of ZnSe, a nitride semiconductor ($In_xAl_yGa_{1-x-y}N$, X+Y≤1), GaP, or the like may be included. In order to emit red light, a semiconductor layer which is composed of GaAlAs or AlInGaP may be included. Light-emitting devices which are made of any other semiconductor material may also be used. Semiconductor compositions, emission colors, sizes, and the numbers of light-emitting devices to be used can be selected as appropriate depending on the purpose. Various emission wavelengths can be selected based on the material and a composition ratio of the semiconductor layer.

Each of the first and second light-emitting elements 41, 42 includes a light-transmissive substrate and a semiconductor multilayer structure layered on the substrate. The semiconductor multilayer structure includes an active layer and an n type semiconductor layer and a p type semiconductor layer interposing the active layer. The first and second light-emitting element 41, 42 includes an n type electrode and a p type electrode which are electrically connected to the n type semiconductor layer and the p type semiconductor layer, respectively. In the first and second light-emitting element 41, 42, the n type electrode and the p type electrode may be on the same surface or on different surfaces. In the present embodiment, as shown in FIG. 3 and FIG. 4, the first and second light-emitting element 41, 42 is flip-chip mounted on the mounting board 30 so that its light emitting surface 41*a*, 42*a* is on the opposite side from the base 35.

The first cover member 51 is disposed on the mounting board 30 so as to cover at least the light emitting surface 41*a* of the first light-emitting element 41. Similarly, the second cover member 52 is disposed on the mounting board 30 so as to cover at least the light emitting surface 42*a* of the second light-emitting element 42. The first and second cover member 51, 52 protects the first and second light-emitting element 41, 42 from the external environment, and also optically controls the light emitted from the first and second light-emitting element 41, 42. In the present embodiment, the first and second cover member 51, 52 control the light emitted from the first and second light-emitting element 41, 42 so that the second light source 32 has a light distribution which is broader than that of the first light source 31.

For the material of the first and second cover member 51, 52, a light-transmissive material such as an epoxy resin, a silicone resin, or a resin mixture of these, glass can be used. Among those, a silicone resin is preferably selected in terms of light resistance and ease of forming.

The second cover member 52 preferably contains a light-diffusing material for diffusing the light emitted from the second light-emitting element 42. With a light-diffusing material, light which goes out from the second light-emitting element 42 in the optical axis L direction is diffused by the light-diffusing material in random directions, thus resulting in a broader light distribution. On the other hand, it is preferable for the first cover member 51 not to contain a light-diffusing material. The optical axes L are defined by normal of the light emitting surfaces 41*a*, 42*a* that passes through the center of the first and second light-emitting elements 41, 42.

The first and second cover member 51, 52 may contain: wavelength converting members that absorb light emitted from the first and second light-emitting element 41, 42 and emit light of at least one different wavelengths, e.g., a phosphor; a colorant corresponding to the emission color of the light-emitting element; and the like.

The wavelength converting member may be a component that absorbs light from the first or second light-emitting element 41, 42, and converts wavelength of the light into a different wavelength. Examples may include yttrium aluminum garnet (YAG)-based phosphors activated by cerium, lutetium aluminum garnet (LAG) activated by cerium, nitrogen-containing calcium aluminosilicate ($CaO—Al_2O_3—SiO_2$)-type phosphors activated by europium and/or chromium, silicate ($(Sr,Ba)_2SiO_4$)-based phosphors activated by europium, β SiAlON phosphors, nitride-based phosphors such as CASN-based or SCASN-based phosphors, KSF-based phosphors ($K_2SiF_6$), sulfide-based phosphors, and the like. Phosphors other than the aforementioned phosphors which have similar performances, actions, and effects may also be used.

The wavelength converting member may be made of luminescent materials that are referred to as so-called nanocrystals or quantum dots, for example. Semiconductor materials may be used for such materials, e.g., II-VI group, III-V group, and IV-VI group semiconductors, specifically, nano-sized high-dispersion particles such as CdSe, core-shell type $CdSxSe_{1-x}/ZnS$, and GaP.

In the case where the first and second cover member 51, 52 do not contain any wavelength converting member, the wavelength ranges and correlated color temperatures of the light emitted by the first light sources 31 and the second light sources 32 are determined by the semiconductor layer compositions of the first and second light-emitting elements 41, 42, respectively. On the other hand, in the case where the first and second cover member 51, 52 contain a wavelength converting member, the wavelength ranges and correlated color temperatures of the light emitted by the first light sources 31 and the second light sources 32 are determined by the fluorescence characteristics or emission characteristics of the wavelength converting member and the compositions of the semiconductor layers of the first and second light-emitting elements 41, 42.

For the light-diffusing material, specifically, oxides such as $SiO_2$, $Al_2O_3$, $Al(OH)_3$, $MgCO_3$, $TiO_2$, $ZrO_2$, ZnO, $Nb_2O_5$, MgO, $Mg(OH)_2$, SrO, $In_2O_3$, $TaO_2$, HfO, SeO, $Y_2O_3$, CaO, $Na_2O$, and $B_2O_3$, nitrides such as SiN, AlN, and AlON, and fluorides such as $MgF_2$ can be used. Such materials may be used singly or in a mixture. Such light-diffusing materials may be provided as a plurality of layers layered in the first or second cover members 51, 52, respectively.

An organic filler may be used for the light-diffusing material. For example, various kinds of resins of particle shapes may be used. Examples of such resins include silicone resins, polycarbonate resins, polyether sulfone resins, polyarylate resins, polytetrafluoroethylene resins, epoxy resins, cyanate resins, phenolic resins, acrylic resins, polyimide resins, polystyrene resins, polypropylene resins, polyvinyl acetal resins, polymethyl methacrylate resins, urethane resins, and polyester resins.

The light-diffusing material is preferably a material that does not substantially convert the wavelengths of the light emitted from the first and second light-emitting elements 41, 42. In the case where the light-diffusing material has a wavelength converting function, when the first and second cover members 51, 52 have predetermined shapes as described below, color unevenness in light distribution may be caused due to differences in thickness of the first and second cover members 51, 52 from the respective light emitting surfaces 41*a*, 41*b* of the first and second light-emitting elements 41, 42 in the light-emitting directions. However, with the light-diffusing material that does not substantially convert the wavelengths of the light emitted from the first and second light-emitting elements 41, 42, a reduction in color unevenness in light distribution can be achieved.

The light-diffusing material may be contained in an amount sufficient to diffuse light, for example, in a range of about 0.01 wt % to about 30 wt %, and preferably in a range of about 2 wt % to about 20 wt %. The light-diffusing material may also have a size sufficient to similarly diffuse light, for example, in a range of about 0.01 μm to about 30 μm preferably in a range of about 0.5 μm to about 10 μm. The shape of the light-diffusing material may be spherical or scale-like, but a spherical shape is preferable to produce uniform diffusion of light. The amount of light-diffusing material can be adjusted based on the difference in refractive index and thickness with respect to those of the second cover member 52.

The shapes of the first and second cover members 51, 52 affect the light distribution characteristics of the first and second light sources 31 and 32, respectively. In the present embodiment, as shown in FIG. 3 and FIG. 4, each of the first and second cover members 51, 52 has a convex shape. The convex shape may be, for example, a substantially hemispheroidal shape, a substantially conical shape, a substantially cylindrical shape, a mushroom shape, or the like. The outer shape of each of the first and second cover members 51, 52 in a top view may be a circle or an ellipse.

Figure 5:
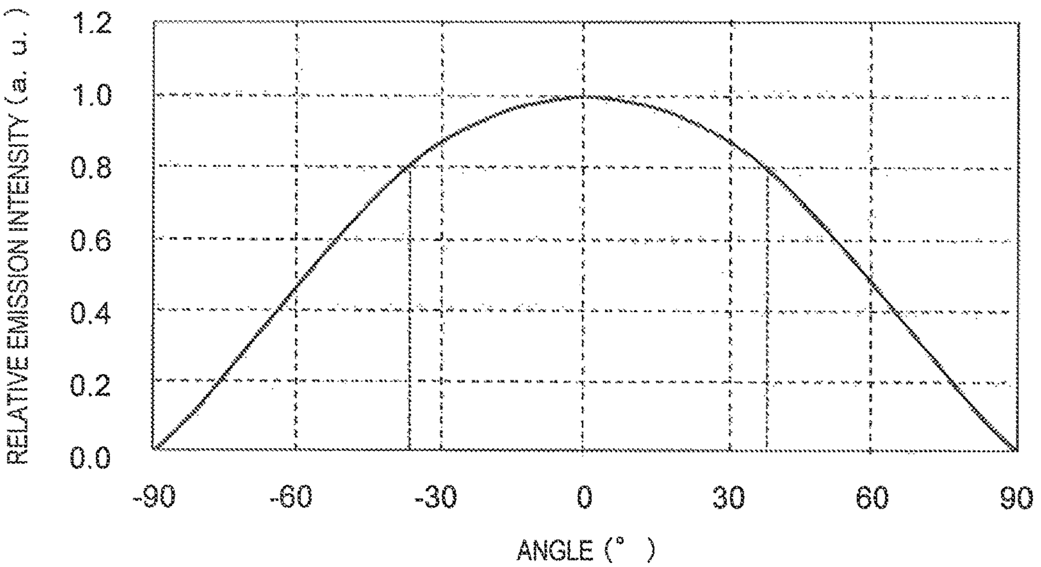
FIG. 5 is a diagram showing a light distribution characteristic of a first light source.
Figure 6:
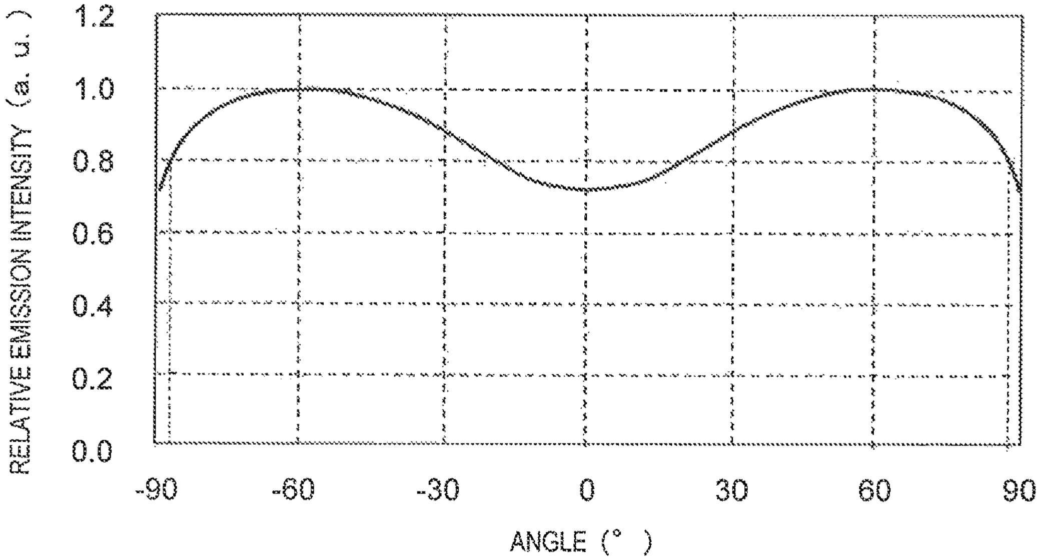
FIG. 6 is a diagram showing a light distribution characteristic of a second light source.

FIG. 5 shows a light distribution characteristic of each first light source 31, and FIG. 6 shows a light distribution characteristic of each second light source 32. In the figures, the light distribution characteristic is represented as a graph in which, in a plane containing an optical axis L, luminous intensity of each light source is measured in an angle range of ±90° with respect to the optical axis L at 0°, and the measured values are plotted against the angles from the optical axis L. The vertical axis represents a relative emission intensity which is normalized to a maximum luminous intensity of 1.

Each of the first light sources 31 has a Lambertian or similar light distribution characteristic. On the other hand, each of the at least one second light source 32 preferably has a batwing light distribution characteristic. A Lambertian or similar light distribution characteristic is defined by an emission intensity distribution where the emission intensity is greatest at 0° and decreases with an increasing absolute value of the light distribution angle. In other words, in a Lambertian or similar light distribution characteristic, brightness is highest at a central portion and decreases toward the peripheral portion. On the other hand, in its broader definition, a batwing light distribution characteristic is defined as an emission intensity distribution where stronger emission intensities exist at angles with greater absolute values of light distribution angle than 0°. In its narrower sense, a batwing light distribution characteristic is defined as an emission intensity distribution where the emission intensity is strongest near absolute values of 50° to 60°. In other words, in a batwing light distribution characteristic, a center portion is darker than the peripheral portion.

In the present specification, in order to compare broadness of light distribution among light sources of various light distribution characteristics, the light distribution angle of a light source is defined as follows. In a light distribution characteristic in the plane containing the optical axis L as mentioned above, assuming that symmetric characteristics exist on the plus side and the minus side of an angle, an angle θ is determined which makes the relative emission intensity 0.8, whereby an angle 2θ is defined as the light distribution angle. For any light distribution characteristic whose relative emission intensity is largest at portions other than 0°, e.g., a batwing light distribution characteristic, the θ which makes the relative emission intensity 0.8 should be employed at portions of largest and smallest angles.

Given a light distribution characteristic as defined above, a batwing light distribution characteristic has a greater light distribution angle than the light distribution angle of a Lambertian or similar light distribution characteristic. In other words, in the case where each of the first light sources 31 has a Lambertian or similar light distribution characteristic and each of the at least one second light source 32 has a batwing light distribution characteristic, the second light sources 32 have a broader light distribution than do the first light sources 31. For example, in the light distribution characteristic shown in FIG. 5, 2θ is about 74°; in the light distribution characteristic shown in FIG. 6, 2θ is about 176°.

When the second cover member 52 of each of the at least one second light source 32 contains a light-diffusing material, assuming that the light-diffusing material diffuses light in an ideal manner, the luminous intensity of light which goes out from the second light sources 32 is approximately proportional to the surface area of the second cover member 52 per light distribution angle. As shown in FIG. 4, given a height A of the second cover member 52 from the mounting board 30 and a width C at which the second cover member 52 is in contact with the mounting board 30, when A=C, the surface area of the second cover member 52 per light distribution angle is essentially equal at any light distribution angle, and thus the relative light distribution intensity is essentially constant from 0° to 90°.

On the other hand, when A>C, i.e., the ratio of the height A to the width C is greater than 1 (A/C>1), at an angle of greater than 0° but smaller than 90°, the relative light distribution intensity is higher than 0° and 90°. In other words, a batwing light distribution characteristic can be realized.

On the other hand, when the first cover member 51 of each of the first light sources 31 has a convex shape and does not contain a light-diffusing material, there is no particular limitation as to the height A and the width C of the first cover member 51. Generally, light which goes out from a light-emitting element has a Lambertian or similar light distribution characteristic; therefore, when the first cover member 51 has a convex shape, the first light source 31 will generally have a Lambertian or similar light distribution characteristic. Even when the first cover member 51 contains a light-diffusing material, so long as A<C is satisfied, the first light source 31 has a Lambertian or similar light distribution characteristic.

Figure 7:
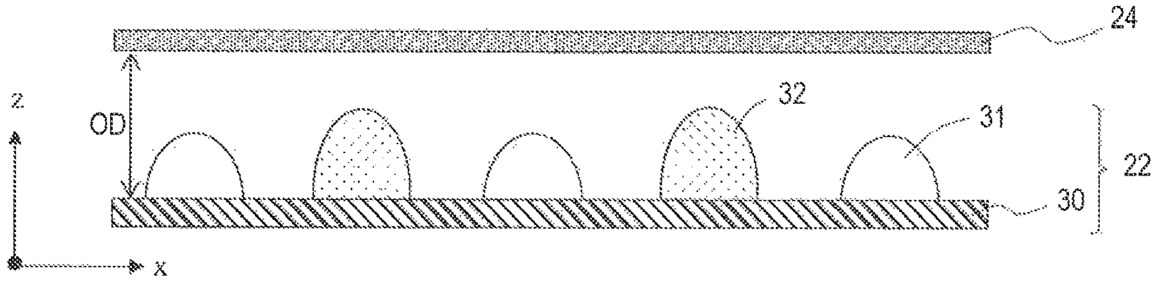
FIG. 7 is a schematic cross-sectional view showing relative positioning between the lighting module and a lighting cover, in the lighting apparatus shown in FIG. 1.

FIG. 7 is a cross-sectional view showing relative positioning between the cover 24 and the lighting module 22 in the lighting apparatus 11. As described earlier, the cover 24 has the function of a light-diffusing plate, and diffuses light from the first and second light sources 31 and 32. As a result, especially when the second light sources 32 are turned on, unevenness in luminance of the cover 24 is reduced and the entire cover 24 appears to emit uniform light without perception of granular light, when the lighting apparatus 11 is seen. Thus appearance of the lighting can be improved.

Generally, in the case of a long array pitch between the light sources, in order to reduce unevenness in the luminous intensity from the light source with a light-diffusing plate, a long distance is needed between the light source and the light-diffusing plate. With the lighting apparatus 11 of present embodiment, however, the second light sources 32, which are fewer in number and which have a greater array pitch, possess a broad light distribution characteristic; therefore, unevenness in the luminance of the cover 24 can be reduced without providing a larger distance from the cover 24. As shown in FIG. 7, the optical distance OD between the mounting board 30 and the cover 24 along a thickness direction (a z axis direction) may be small. This allows the thickness of the lighting apparatus 11 to be reduced, thus a thin lighting apparatus with good appearance can be realized.

For example, as shown in FIG. 2, when P1 and P2 represent the pitches of the first light sources 31 and the second light sources 32 respectively, the inequalities (1) given below are satisfied:

$$0.7 \leq OD/P1 \leq 12.0$$

$$0.2 \leq OD/P2 \leq 0.8. \quad (1)$$

Accordingly, as described above, when lighting the first and second light sources 31 and 32, unevenness in luminance at the cover 24 of the lighting apparatus 11 can be more reliably reduced.

For example, a typical value fof the optical distance OD that is estimated for a lighting apparatus is in a range of about 10 mm to about 40 mm. According to the inequalities (1), when the optical distance OD is 10 mm, P1 is in a range of about 7 mm to about 20 mm, and P2 is in a range of about 2 mm to about 8 mm. When the optical distance OD is 40 mm, P1 is in a range of about 28 mm to about 80 mm, and P2 is in a range of about 8 mm to about 64 mm.

Manufacturing Method of Lighting Module

The lighting module 22 can be manufactured by the method illustrated below, for example. First, a mounting board 30 having conductive wiring 36 in a pattern which is adapted to the arrangement of the first and second light sources 31 and 32 is provided. Then, the first and second light-emitting elements 41, 42 are bonded to the mounting board 30. For example, flip chip bonding may be used to mount the first and second light-emitting elements 41, 42 onto the mounting board 30.

Then, the first and second cover members 51, 52 are prepared according to the composition described above. The first and second cover member 51, 52 can be formed by compression molding or injection molding so as to cover the first and second light-emitting element 41, 42. Otherwise, the viscosity of a material of the first and second cover member 51, 52 may be optimized so that the material can be applied dropwise or in a manner of drawing onto the first and second light-emitting element 41, 42, thus allowing a shape as shown in FIG. 3 or FIG. 4 to be formed on the basis of the surface tension of the material itself. With this method, the first and second cover members 51, 52 can be formed on the mounting board 30 in a simpler manner, without requiring a mold. Adjustment of the viscosity of the material for the cover members in such a method can be made not only with the viscosity of the material itself, but also with the light-diffusing material, the wavelength converting member, and the colorant. In this manner, the lighting module is made.

As described above, with the lighting module of the present embodiment, second light sources which are fewer in number have a broader light distribution, so that there is little difference in uniformity in luminance distribution within the light emitting surfaces between the first light sources and second light sources, across the entire lighting module. Therefore, in the case where either the first light sources or the second light sources are selectively turned on, there is little difference in the appearance between the two types of light sources. On the other hand, when the first light sources and the second light sources are simultaneously turned on, it is possible to uniformly mix the light from the two types of light sources. Since the quantity of second light sources to be mounted can be reduced, it is possible to reduce the manufacturing cost.

Moreover, with the lighting module of the present embodiment, each of the second light sources has a broader light distribution, so that unevenness in luminance on the cover when the second light sources are turned on can be reduced. The entire cover appears as if uniformly emitting light, whereby a lighting apparatus with good appearance can be realized. Further, a larger interspace is not needed between the cover and the mounting board on which the light sources are arranged, whereby a thin lighting apparatus can be realized.

Other Embodiments and Variants

Other embodiments and variants of the lighting apparatus and the lighting module are described below.

Figure 8:
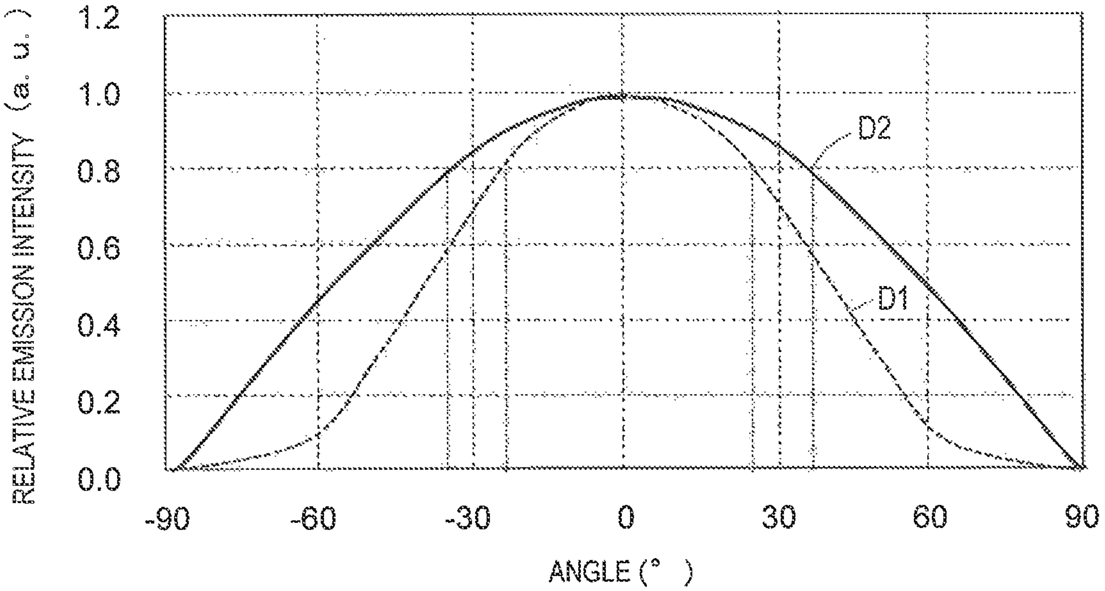
FIG. 8 is a diagram showing another example of light distribution characteristics of the first and second light sources.
Figure 9:
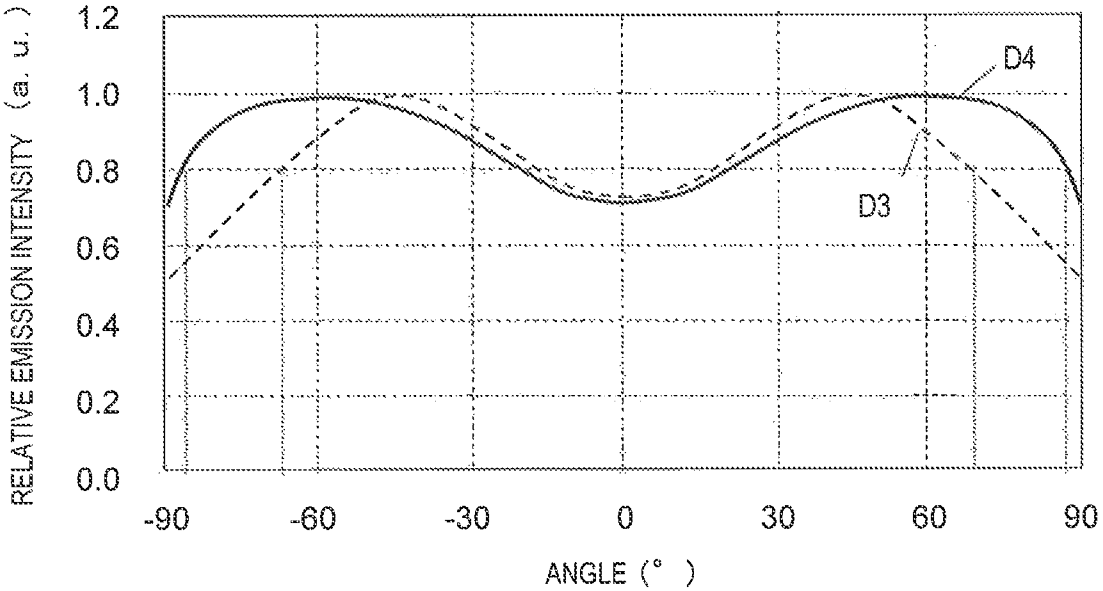
FIG. 9 is a diagram showing still another example of light distribution characteristics of the first and second light sources.

Firstly, in the above embodiment, the first light sources 31 each have a Lambertian or similar light distribution characteristic, whereas the second light sources 32 each have a batwing light distribution characteristic; however, other combinations of light distribution characteristics can be used. For example, as shown in FIG. 8, the first light sources 31 and the second light sources 32 may both have Lambertian or similar light distribution characteristics D1 and D2. In this case, too, each of the at least one second light source 32 has a light distribution which is broader than that of each of the first light sources 31. In the example shown in FIG. 8, for example, 2θ in the light distribution characteristic D1 of each of the first light sources 31 is about 50°, whereas 2θ in the light distribution characteristic D2 of each of the at least one second light source 32 is about 70°. On the other hand, as shown in FIG. 9, the first light sources 31 and the second light sources 32 may both have batwing light distribution characteristics D3 and D4. In this case, too, the light distribution of each of the second light sources 32 is broader than that of each of the first light sources 31. In the example shown in FIG. 9, for example, 2θ in the light distribution characteristic D3 of each of the first light sources 31 is about 140°, whereas 2θ in the light distribution characteristic D4 of each of the at least one second light source 32 is about 170°.

Figure 10A:
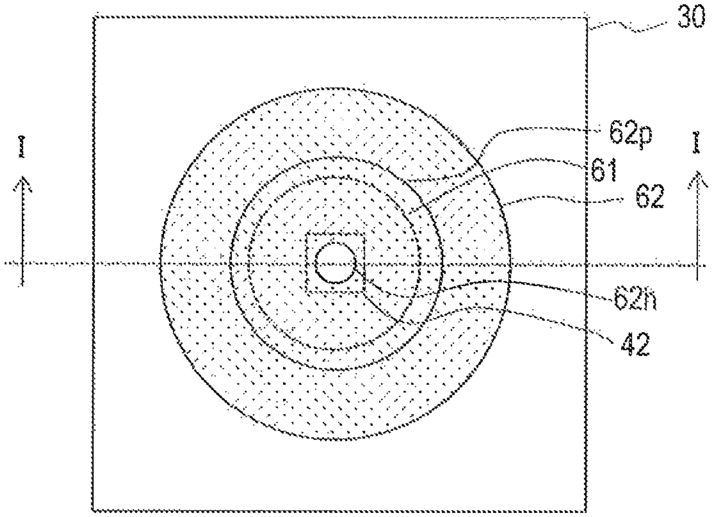
FIG. 10A is a top view showing another example of a light source having a batwing light distribution characteristic.
Figure 10B:
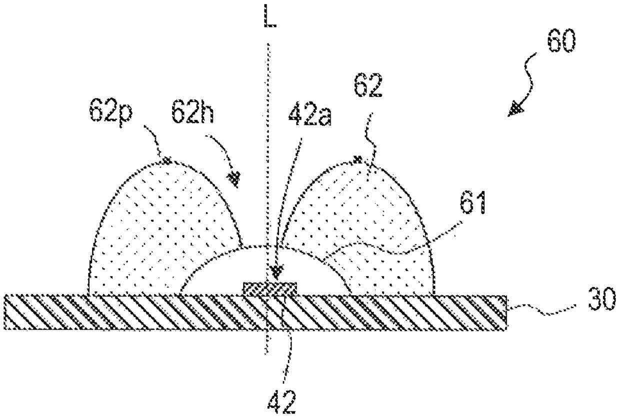
FIG. 10B is a cross-sectional view of the light source shown in FIG. 10A, taking along line I-I.

There are other variations in the shape of the cover member to realize a batwing light distribution characteristic in addition to that of the above embodiment. For example, a batwing light distribution characteristic can be realized also by using a light source 60 that is shown in FIG. 10A and FIG. 10B. FIG. 10A is a top view of the light source 60, and FIG. 10B is an I-I cross-sectional view in FIG. 10A. The light source 60, which is disposed on the mounting board 30, includes a second light-emitting element 42, a wavelength converting member 61, and a cover member 62. The second light-emitting element 42 is bonded to the mounting board 30, whereas the wavelength converting member 61 is disposed on the mounting board 30 so as to cover a light emitting surface 42*a* of the second light-emitting element 42. The wavelength converting member 61 contains a light-transmissive resin, glass, or the like, and a wavelength converting material (e.g., a phosphor) which is dispersed therein. The cover member 62 has a through-hole 62*h* in which the optical axis L of the second light-emitting element 42 is contained, and is disposed on the mounting board 30 so as to cover a part of the wavelength converting member 61. In the top view, the cover member 62 has a ring shape. As viewed in a plane containing the optical axis L, the cover member 62 has two cross sections which are separated by the through-hole 62*h*. Each cross section has a curved convex shape, e.g., a circular arc, an ellipse, or a parabola, with a ridge 62*p*. The ridge 62*p* appears as a circle in the top view. The cover member 62 may be made of the same material as the second cover member 52 in the above embodiment, but may or may not contain a light-diffusing material. The cover member 62 with such a shape can create a batwing light distribution characteristic.

Figure 11A:
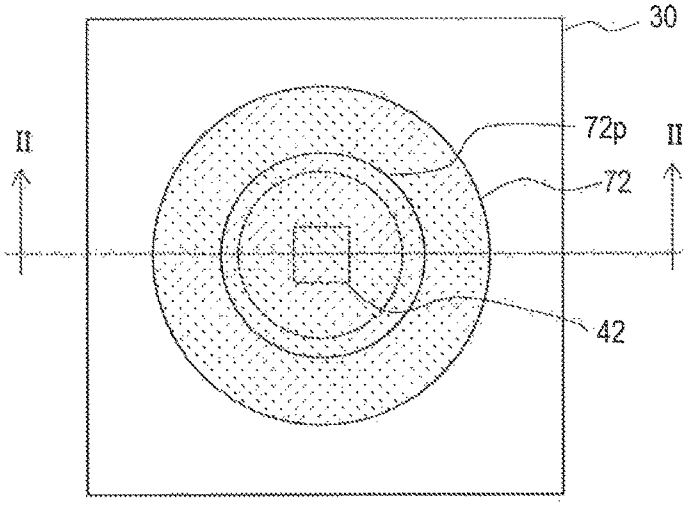
FIG. 11A is a top view showing another example of a light source having a batwing light distribution characteristic.
Figure 11B:
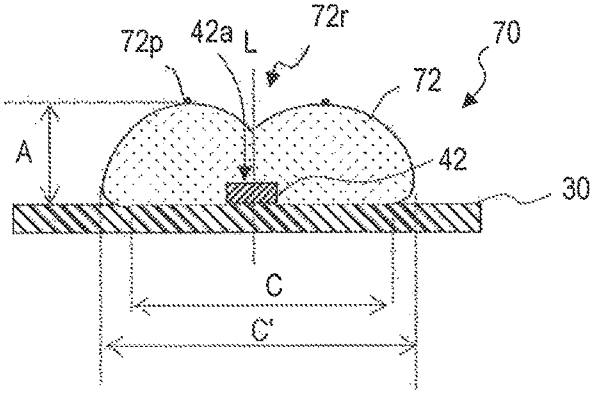
FIG. 11B is a cross-sectional view of the light source shown in FIG. 11A, taking along line II-II.

A light source 70 that is shown in FIG. 11A and FIG. 11B may be used to create a batwing light distribution characteristic. FIG. 11A is a top view of the light source 70, and FIG. 11B is an II-II cross-sectional view in FIG. 11A. The light source 70, which is disposed on the mounting board 30, includes a second light-emitting element 42 which is bonded to the mounting board 30, and a cover member 72. The second light-emitting element 42 is bonded to the mounting board 30, whereas the cover member 72 is disposed on the mounting board 30 so as to cover a light emitting surface 42*a* of the second light-emitting element 42.

In top view, the cover member 72 has a circular shape. Moreover, the cover member 72 has a recess 72*r* on the optical axis L, and has a ridge 72*p* outside of the recess 72*r* as viewed in a plane containing the optical axis L. The ridge 72*p* of the cover member 72 has a circular shape in top view.

Preferably, the height A of the cover member 72 is smaller than the maximum width C' of the cover member 72. It is preferable that the width C of a surface of the cover member that is in contact with the mounting board 30 is smaller than the maximum width C'. In other words, it is preferable that A>C', C'>C. The cover member 72 with such a shape can create a batwing light distribution characteristic.

Figure 12:
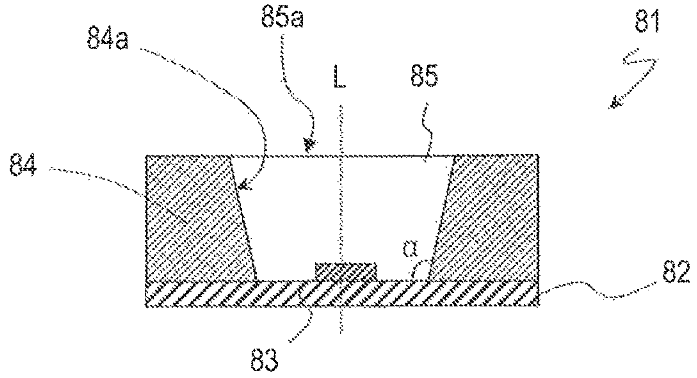
FIG. 12 is a cross-sectional view showing another example of first and second light sources.

The embodiment describes that each light source of the lighting module is in the form of a bare chip; instead, packaged light sources may be mounted on the mounting board. For example, a light source 81 shown in FIG. 12 includes a mounting board 82, a light-emitting element 83 which is bonded to the mounting board 82, a reflector 84 surrounding the light-emitting element 83 on the mounting board 82, and a cover member 85 which covers a space that is created by the reflector 84 so that the light-emitting element 83 is embedded therein. The reflector 84 has a reflection surface 84*a* facing lateral surfaces of the light-emitting element 83. The reflection surface 84*a* may be a lateral surface of a frustum of a cone, or the lateral surfaces of a frustum of a pyramid, for example. The reflection surface 84*a* reflects light emitted from the light-emitting element 83. The cover member 85 can be composed of a material having a similar composition to that of the aforementioned cover member 85 or second cover member 52, for example. Although an upper surface 85*a* of the cover member 85 is illustrated as flat in FIG. 12, it may instead have a convex shape in order to allow light emitted from the light-emitting element 83 to be refracted in a desired direction.

The light distribution characteristic of the light source 81 changes with a tilt angle $\alpha$ of the reflection surface 84*a* of the reflector 84, the material of the cover member 85, and the shape of the upper surface 85*a*. Therefore, by varying these elements, the light source 81 may have a broader or narrower light distribution, thus resulting in two kinds of light sources 81 with different light distribution characteristics which can be used for the first and second light sources described in the above embodiment. In this case, a cover member may or may not be formed on the light source 81.

Thus, the light distribution characteristic of each light source may be affected not only by the shape of the cover member, but also by other conditions, e.g., light outgoing characteristics of the light-emitting device, material characteristics of the cover member, presence or absence of a reflector, and so on.

Figure 13:
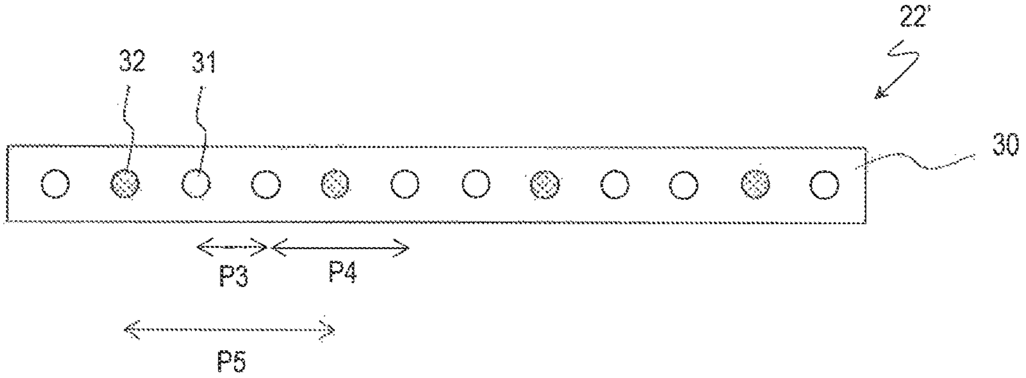
FIG. 13 is a top view showing another example arrangement of light sources in the lighting module.

Although the above embodiment illustrates that the light sources are disposed in a two-dimensional array in the lighting module, the lighting module may alternatively include light sources which are in a one-dimensional array. A lighting module 22' shown in FIG. 13 includes a mounting board 30 and first light sources 31 and second light sources 32 which are arranged in a one-dimensional manner on the mounting board 30. The first light sources 31 are arrayed with repeating combinations of a pitch P3 and a pitch P4, with the second light sources 32 being arranged among them at a pitch P5. In this case, an average array pitch of the first light sources 31 is (P3+P4)/2, which is smaller than the array pitch P5 of the second light sources 32. Therefore, in the lighting module 22', the quantity of second light sources 32 is smaller than the quantity of first light sources 31. However, since the light distribution of each of the at least one second light source 32 is broader than that of each of the first light sources 31, similarly to the above embodiment, there is little difference in non-uniformity in luminance distribution between the first light sources and the second light sources across the entire lighting module. Moreover, the quantity of the second light sources can be reduced, which allows for effects such as a reduction in the manufacturing cost and a reduction in unevenness in luminance on the cover when used in a lighting apparatus, and realizing a thin-type lighting apparatus.

Figure 14:
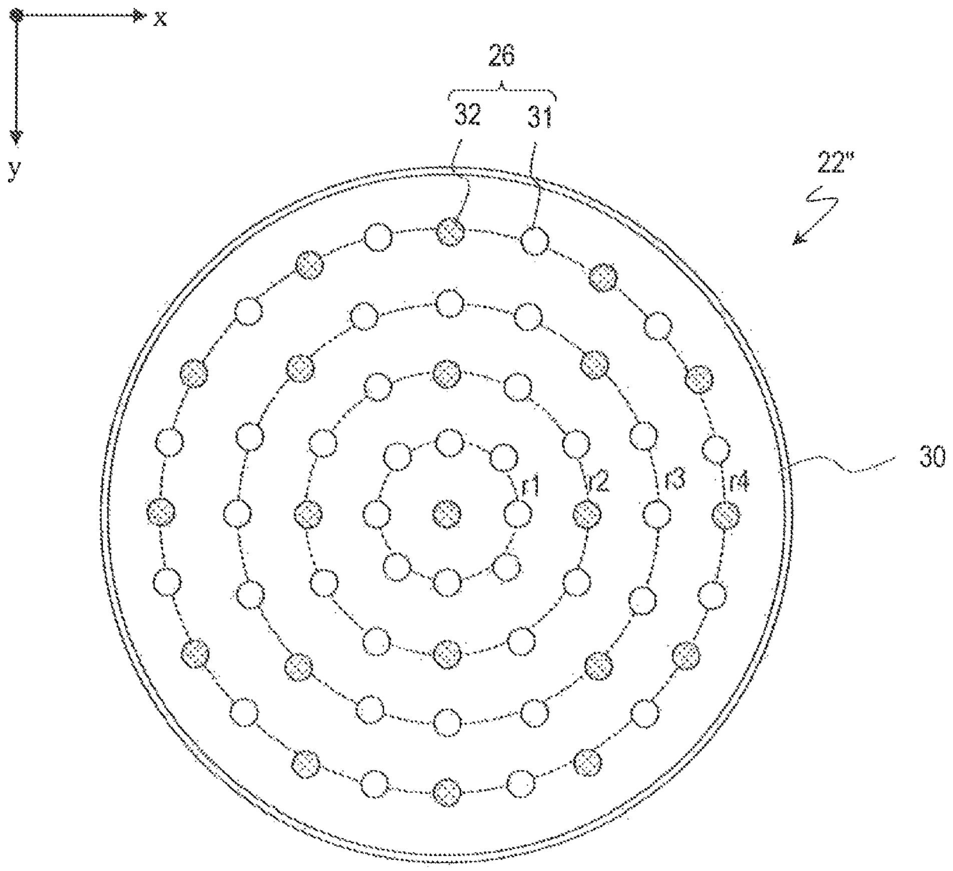
FIG. 14 is a top view showing another example arrangement of light sources in the lighting module.

The arrangement of light sources in the lighting module may be alternatives other than the arrangement being equally pitched along two directions. For example, in a lighting module 22" shown in FIG. 14, a plurality of light sources is arranged in concentric circles on a mounting board 30. More specifically, as indicated by broken lines in FIG. 14, a plurality of first light sources 31 and a plurality of second light sources 32 are arranged in the form of concentric circles. In this case, a pitch P1 of the first light sources 31 and a pitch P2 of the second light sources 32 may be found for each of the concentric circles r1 to r4, and an arrangement of the first light sources 31 and the second light sources 32 and an optical distance OD may be determined so that the pitches P1 and P2 in the respective concentric circle satisfy the inequality relationship (1).

The period with which the light sources are arrayed in the lighting module may not be constant across the entire lighting module; instead, the light sources may be arranged with periods which are locally different. In this case, at least in portions where the first and second light sources are arranged so as to satisfy the inequality relationship (1), a sufficient effect of reducing unevenness in luminance within the lighting apparatus can be obtained as described above. Some or all of the light sources on the mounting board may be randomly arranged. Also in this case, unevenness in luminance of the second light sources is reduced because of the greater light distribution angle of the second light sources, which are fewer in number. Especially, a sufficient effect of reducing unevenness in luminance within the lighting apparatus is obtained when the distance of every adjacent pair of light sources respectively satisfies the inequality relationship (1), even in a random arrangement.

The first light sources 31 and the second light sources 32 in the above embodiment emit white light of correlated color temperatures that are different from each other. However, this is not the only combination of light emitted by the first light sources 31 and light emitted by the second light sources 32. For example, either the first or second light sources 31 or 32 may emit white light, while the other light sources 32 or 31 may emit monochromatic light. More specifically, for example, the first light sources 31 may emit white light of daylight color, while the second light sources 32 may emit red light. In this case, the second light sources 32 are fewer in number but have a greater light distribution angle, so that unevenness in luminance with respect to red light is reduced across the entire lighting apparatus, whereby light of a reddish white color is distributed across the entire cover of the lighting apparatus. Thus, dimming with good color rendering properties can be realized. The first light sources 31 and the second light sources 32 may emit monochromatic light, while the first light sources 31 and the second light sources 32 have different wavelength ranges from each other. In this case, too, a lighting apparatus is realized in which light of two different wavelength ranges is uniformly mixed.

Experimental Examples

In order to confirm the effects of the lighting apparatus according to the embodiment, a simulation was conducted for evaluation. Specifically, non-uniform luminance across the cover in the case where the first and second light sources 31 and 32 were arranged as shown in FIG. 2 was evaluated. The pitches P1 and P2 in FIG. 2 were set to 25 mm and 50 mm, respectively. The optical distance OD, i.e., a distance between the mounting board 30 and the cover 24 as shown in FIG. 7, was set to 25 mm. The resultant values are OD/P1=1 and OD/P2=0.5. Those values are approximate medians of the respective inequalities (1).

Figure 15:
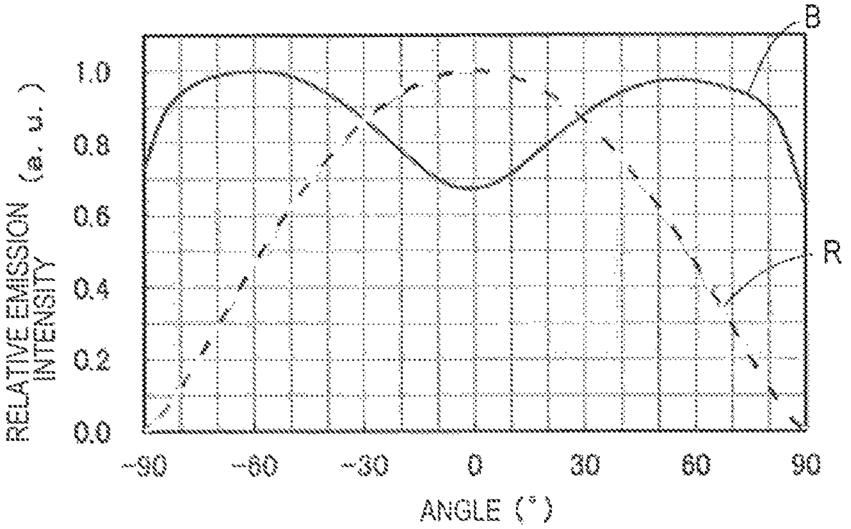
FIG. 15 is a diagram showing light distribution characteristics of light sources used in a simulation.

FIG. 15 shows light distribution characteristics of light sources which were used in the simulation. In FIG. 15, a curve R represents a Lambertian light distribution characteristic, i.e., a light distribution characteristic of the first light sources 31, whereas a curve B represents a batwing light distribution characteristic, i.e., a light distribution characteristic of the second light sources 32.

Figure 16:
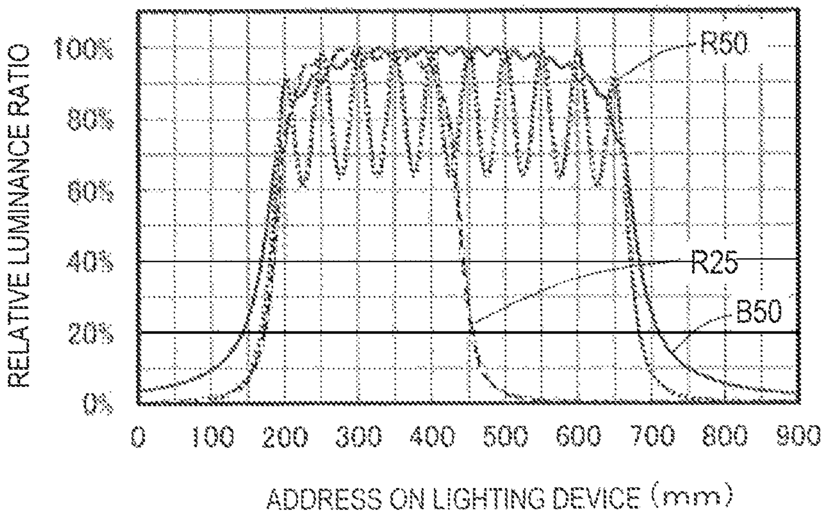
FIG. 16 is a diagram showing luminance distributions which were determined through simulation.

FIG. 16 shows luminance distributions on the cover. The horizontal axis represents the relative position on the cover, and the vertical axis represents the relative luminance ratio with setting the highest luminance as 100%.

In FIG. 16, a curve R25 represents a luminance distribution of the case where ten light sources each having a Lambertian light distribution characteristic were arranged at a pitch of 25 mm. A curve B50 represents a luminance distribution of the case where ten light sources each having a batwing light distribution characteristic were arranged at a pitch of 50 mm. A curve R50 represents a luminance distribution of the case where ten light sources each having a Lambertian light distribution characteristic were arranged at a pitch of 50 mm.

In FIG. 16, as indicated by the curve R25, when light sources each having a Lambertian light distribution characteristic are arranged at a pitch of 25 mm, the relative luminance ratio is not less than approximately 90% except at both ends of the array, indicative of very little unevenness in luminance. On the other hand, as indicated by the curve R50, when light sources each having a Lambertian light distribution characteristic are arranged at a pitch of 50 mm, the elongated distance between light sources allows portions of low luminance to exhibit between one light source and another. As can be seen from FIG. 16, the relative luminance ratio is less than 70% in the dark portions.

As indicated by the curve B50, when light sources each having a batwing light distribution characteristic are arranged at a pitch of 50 mm, the relative luminance ratio is not less than approximately 90% except at both ends of the array, indicative of very little unevenness in luminance. It can be seen from FIG. 16 that the unevenness in luminance of the curve B50 is as small as the unevenness in luminance of the curve R25. According to the embodiment of the present disclosure, it was found that use of the second light sources 32 having a batwing light distribution characteristic allows unevenness in luminance on the cover to be as small as that of the first light sources 31. In the arrangement shown in FIG. 2, the quantity of first light sources 31 is 56, whereas the quantity of second light sources is 25; thus, it was found that, even when the quantity of second light sources 32 is less than a half of the quantity of first light sources 31, essentially the same level of unevenness in luminance is still attained.

Figure 17:
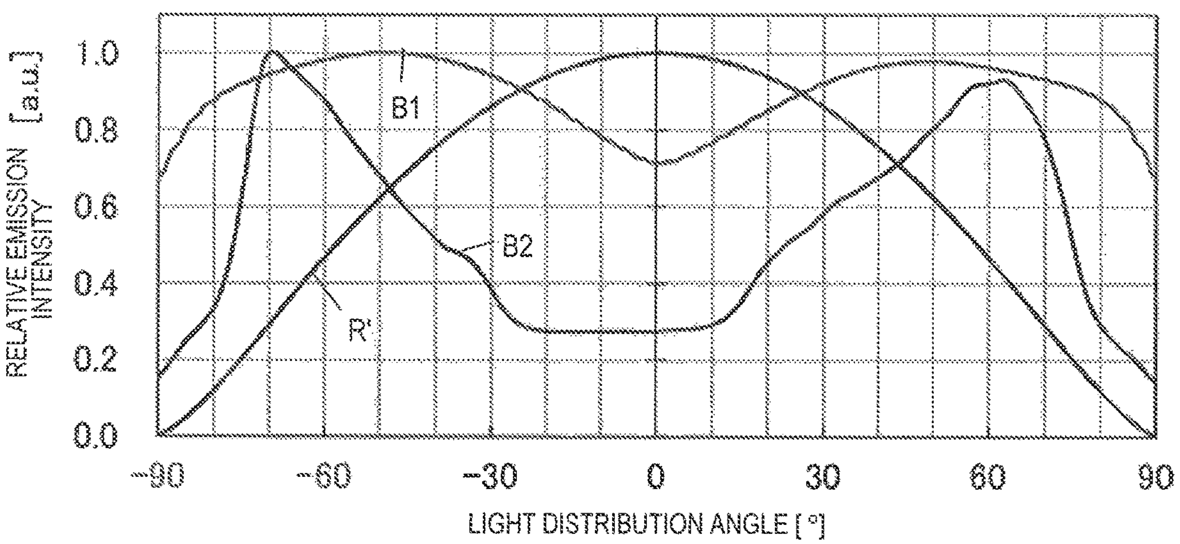
FIG. 17 is a diagram showing light distribution characteristics of light sources used in a simulation for determining a range of OD/P2. (OD: optical distance, P2: pitch 2)
Figure 18:
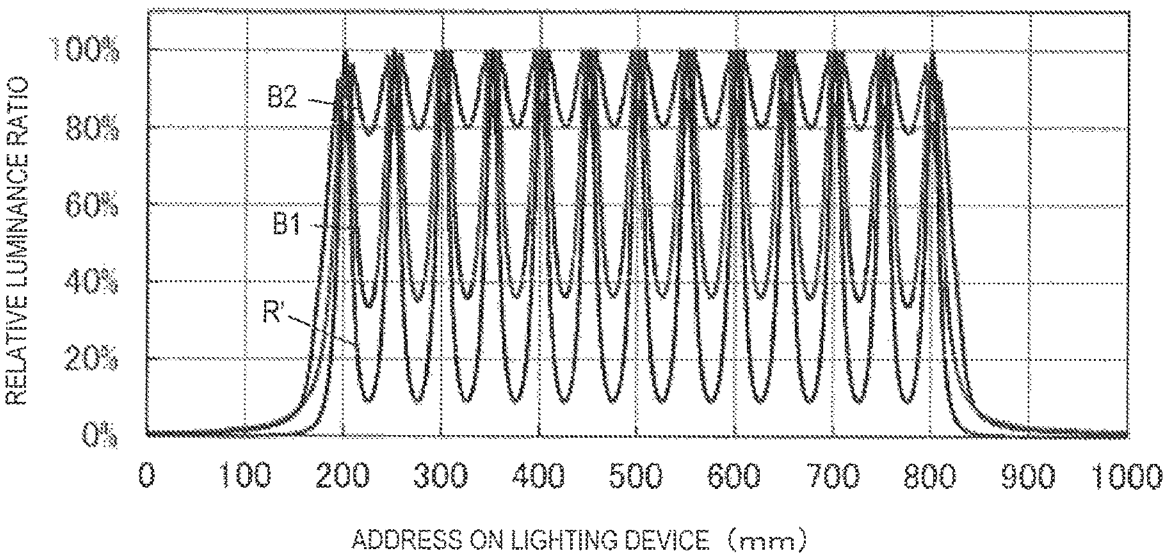
FIG. 18 is a diagram showing luminance distributions in the case where OD/P2 is 0.2, as determined through simulation.
Figure 19:
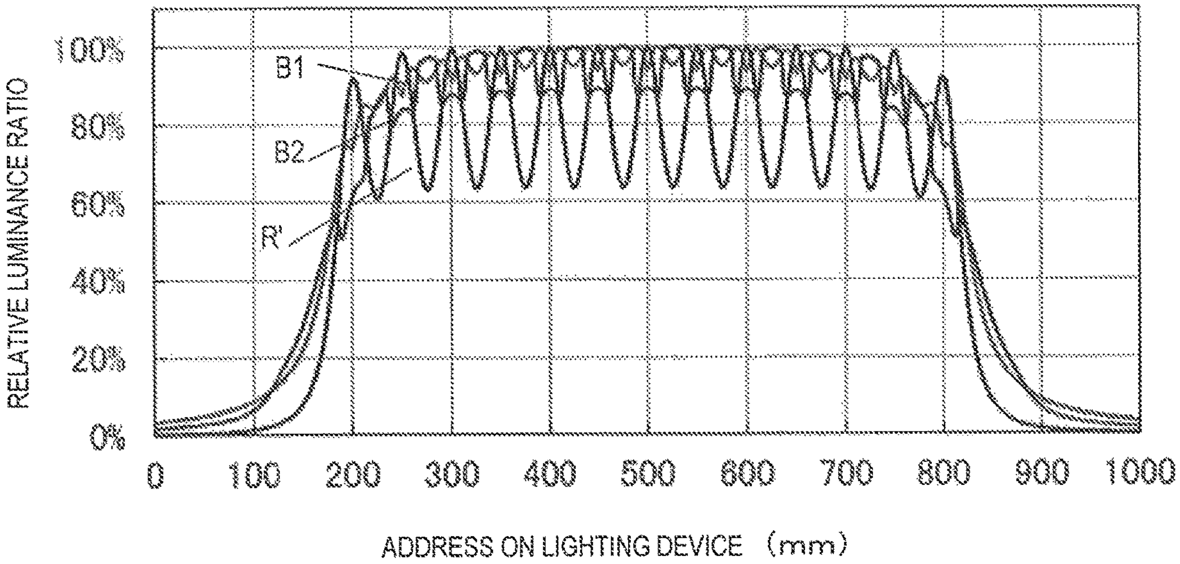
FIG. 19 is a diagram showing luminance distributions in the case where OD/P2 is 0.5, as determined through simulation.
Figure 20:
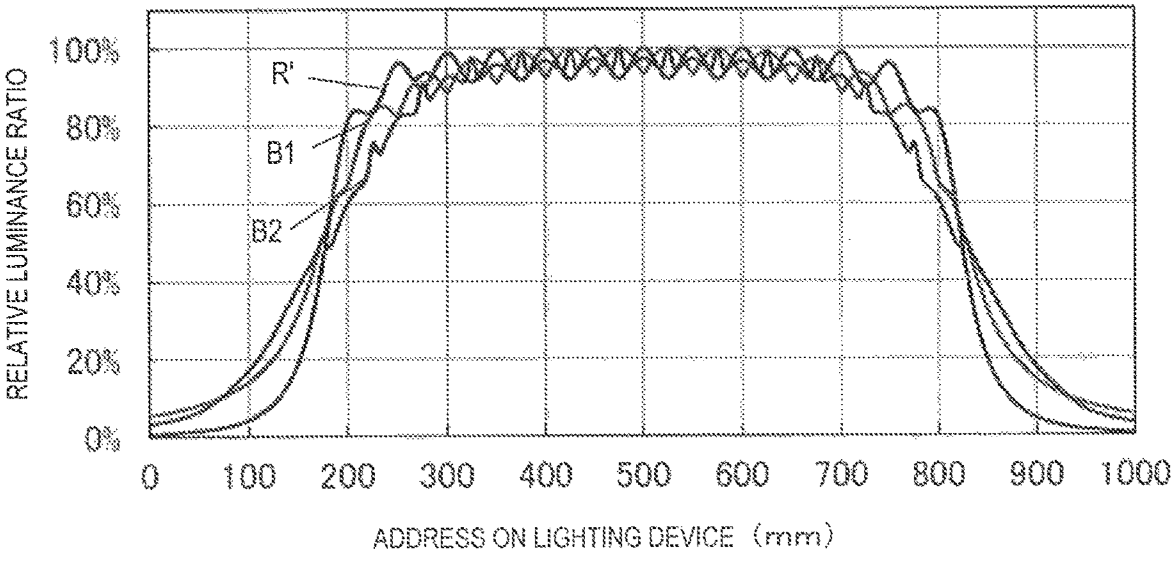
FIG. 20 is a diagram showing luminance distributions in the case where OD/P2 is 0.8, as determined through simulation.

Then, an appropriate range of OD/P2 was determined through a simulation. More specifically, second light sources 32 having batwing light distribution characteristics shown by the curves B1 and B2 in FIG. 17 were provided, and, as shown in FIG. 2, the second light sources 32 were arranged at P2=50 mm. The luminance distribution on the cover was measured while changing the distance OD between the mounting board 30 and the cover 24 shown in FIG. 7. FIG. 18, FIG. 19 and FIG. 20 show luminance distributions in the cases where OD/P2 is 0.2, 0.5 and 0.8, respectively. For comparison, light sources having a Lambertian light distribution characteristic as indicated by a curve R' in FIG. 17 were arranged at a pitch of 50 mm, and its luminance distribution was measured in the same manner.

As shown in FIG. 18, in the case where OD/P2 is 0.2, the curve B2 has a relative luminance ratio of about 80% or more even in the dark portions. As shown in FIG. 19, in the case where OD/P2 is 0.5, the relative luminance ratio in the dark portions is about 80% or more in both of the curves B1 and B2.

As shown in FIG. 20, in the case where OD/P2 is 0.8, the relative luminance ratio in dark portions is about 90% or more, not only for the curves B1 and B2 but also for the curve R'. Thus, hardly any difference in luminance distribution exists between the light sources having a Lambertian light distribution characteristic and the second light sources 32 having a batwing light distribution characteristic. In other words, with a sufficiently large OD (i.e., P2×0.8 or greater) for the given P2, the luminance distribution on the cover is uniform even if the second light sources 32 may not have a large light distribution angle.

With these results, it was found when OD/P2 is in a range of 0.2 to 0.8, the second light sources 32 will have their non-uniform luminance reduced by having a batwing light distribution characteristic. Through a similar simulation, it was found that OD/P1 is preferably in a range of 0.7 to 2.

A lighting module and a lighting apparatus according to embodiments of the present disclosure can be used for various applications, e.g., indoor lighting, various types of indicators, displays, backlights for liquid crystal displays, sensors, signal devices, automotive parts, and channel letter for signage.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A lighting apparatus comprising:

a lighting module comprising:

a mounting board, a plurality of first light sources and a plurality of second light sources located on the mounting board, wherein the plurality of first light sources and the plurality of second light sources are mixed together on the mounting board, and wherein a wavelength range and/or a correlated color temperature of the plurality of first light sources is different from a wavelength range and/or a correlated color temperature of the plurality of second light sources; and a light-diffusing plate;

wherein the plurality of first light sources and the plurality of second light sources are located between the light-diffusing plate and the mounting board;

wherein a light distribution angle of each of the second light sources is greater than a light distribution angle of each of the first light sources; and wherein, based on an interspace (OD) between the light-diffusing plate and the mounting board, an array pitch P1 of the plurality of first light sources on the mounting board and an array pitch P2 of the plurality of second light sources on the mounting board satisfy the following relationship:

$$0.7 \leq OD/P1 \leq 2.0$$

$$0.2 \leq OD/P2 \leq 0.8$$

2. The lighting apparatus of claim 1, wherein the plurality of first light sources and the plurality of second light sources are arranged one-dimensionally or two-dimensionally.

3. The lighting apparatus of claim 1, wherein each of the plurality of first light sources and each of the plurality of second light sources emit white light, and a correlated color temperature of each of the plurality of second light sources is lower than a correlated color temperature of each of the plurality of first light sources.

4. The lighting apparatus of claim 1, wherein the plurality of first light sources emit white light, and the plurality of second light sources emit monochromatic light.

5. The lighting apparatus of claim 1, wherein both the plurality of first light sources and the plurality of second light sources emit monochromatic light; and wherein a wavelength range of the plurality of first light sources and a wavelength range of the plurality of second light sources are different from each other.

6. The lighting apparatus of claim 1, wherein each of the plurality of first light sources has a Lambertian or similar light distribution characteristic.

7. The lighting apparatus of claim 1, wherein each of the plurality of second light sources has a batwing light distribution characteristic.

8. The lighting apparatus of claim 1, wherein each of the plurality of first light sources and each of the plurality of second light sources have a light emitting surface and a cover member covering the light emitting surface.

9. The lighting apparatus of claim 8, wherein each of the plurality of first light sources and each of the plurality of second light sources includes at least one light-emitting element that is bonded to the mounting board and that has the light emitting surface; and wherein each cover member is disposed on the mounting board and covers a respective at least one light-emitting element.

10. The lighting apparatus of claim 1, wherein the mounting board is a flexible mounting board.

11. The lighting apparatus of claim 1, wherein the plurality of first light sources and the plurality of second light sources are arranged so as to be mixed together on the mounting board such that at least some of the first light sources are between some of the second light sources, and at least some of the second light sources are between some of the first light sources.

12. The lighting apparatus of claim 1, wherein the array pitch P2 of the plurality of second light sources on the mounting board is larger than the array pitch P1 of the plurality of first light sources on the mounting board.

13. The lighting apparatus of claim 1, wherein a quantity of the first light sources is greater than a quantity of the second light sources.

* * * * *